United States Patent [19]

Gegenwart

[11] Patent Number: 5,334,298
[45] Date of Patent: Aug. 2, 1994

[54] SPUTTERING CATHODE

[75] Inventor: Rainer Gegenwart, Rödermark, Fed. Rep. of Germany

[73] Assignee: Leybold AG, Hanau, Fed. Rep. of Germany

[21] Appl. No.: 963,467

[22] Filed: Oct. 20, 1992

[30] Foreign Application Priority Data

Jan. 22, 1992 [DE] Fed. Rep. of Germany ....... 4201551

[51] Int. Cl.⁵ ............................................. C23C 14/35
[52] U.S. Cl. .................. 204/192.12; 204/298.11; 204/298.19
[58] Field of Search ............... 204/298.11, 298.19, 204/192.12

[56] References Cited

U.S. PATENT DOCUMENTS

| 4,169,031 | 9/1979 | Brors | 204/192.12 |
| 4,515,675 | 5/1985 | Kieser et al. | 204/298.19 |
| 4,606,802 | 8/1986 | Kobayashi et al. | 204/192.15 |
| 5,269,896 | 12/1993 | Munemasa et al. | 204/192.38 |

FOREIGN PATENT DOCUMENTS

| 0210473 | 2/1987 | European Pat. Off. | 204/298.19 |
| 3411536 | 1/1985 | Fed. Rep. of Germany | 204/298.19 |
| 2417288 | 3/1988 | Fed. Rep. of Germany | 204/298.19 |
| 3738845 | 5/1989 | Japan | 204/298.19 |

*Primary Examiner*—Aaron Weisstuch
*Attorney, Agent, or Firm*—Felfe & Lynch

[57] ABSTRACT

The invention relates to a sputtering cathode operating on the magnetron principle, which has a cathode body equipped with a target having a sputtering surface and a peripheral surface. In back of the target a magnet system is provided which has poles of opposite polarity lying one opposite the other for the production of magnetic lines of force which issue from the target and, after traversing arcuate paths, re-enter the target. The marginal areas of the target lying outside of the erosion zone are covered over by an extension of the dark space shield which runs parallel to the sputtering surface and has an inner margin. The dark space shield 11 is electrically floating and is separated from the target by a gap which is so large that no plasma can ignite between the target and dark space shield, so that only the exposed target is sputtered.

8 Claims, 1 Drawing Sheet

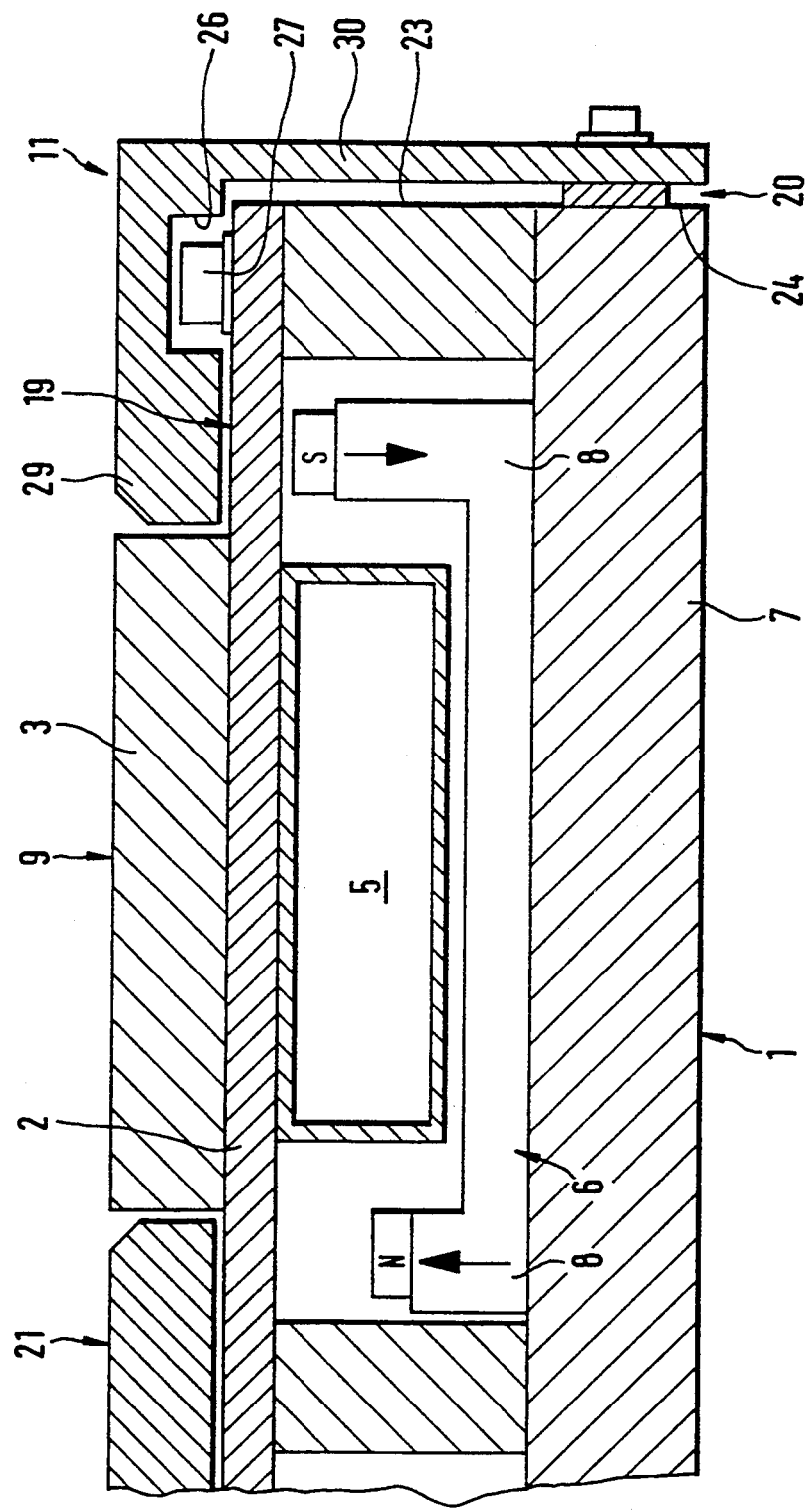

SPUTTERING CATHODE

FIELD OF THE INVENTION

The invention relates to a sputtering cathode operating on the magnetron principle, having a cathode body which is equipped with a sputtering surface and a target having a generally oval surface, a racetrack magnet system being provided in back of the target and having poles of opposite polarity one inside the other for the production of magnetic lines of force which issue from the target and after traveling arcuate paths reenter the target, while the marginal areas of the target lying outside of the erosion zone are covered by an extension of the dark space shield running parallel to the sputtering surface and having an inner margin.

BACKGROUND OF THE INVENTION

It is already known (DE OS 37 38 845 A1, DE 34 11 536 C2) to limit a target to only the area that is to be sputtered or ablated. This is achieved advantageously in the case of the interpolar target cathode by having the target alone at potential. Furthermore, in the case of large cathodes used in glass coating apparatus it is achieved by covering with masks those areas of the target which are not sputtered or ablated. This, however, has the disadvantage that these masks also become coated and these portions of the coating can flake off, fall onto the substrate, and thus render it unusable. In the case of relatively large cathodes, for example those of great length, such masks can become relatively easily distorted due to their instability, so that short-circuiting can occur.

If reactive sputtering processes are performed by cathode sputtering using a noble gas atmosphere and metal is sputtered and oxides or nitrides are to be formed, a reactive gas is fed to this atmosphere. The reaction products thus obtained are normally deposited not only on the substrate but also on the target surface. If such reaction products are highly insulating, such as silicon oxide or aluminum nitride, the charging up of this surface results in dielectric breakdowns, i.e., so-called flashover (arcing) and therefore also in stability problems. In highly reactive processes, these stability variations cause the layers to become irregular and the arcing causes particles to flake off from the target surface and then deposit themselves on the substrate. Especially in electronics, if insulating coatings are involved, this renders the substrate unusable. In the production of optical coatings, irregularly applied coatings can result in greater light scattering in the coating.

SUMMARY AND OBJECTS OF THE INVENTION

Here the invention seeks to provide help and to affect the plasma intensity by appropriate measures such that the target will not be sputtered in a planar manner, as in the case of a diode, but preferably in the center or at a point where the plasma intensity is highest, not as formerly in the outside area, i.e., in an area of lesser plasma intensity. This problem is solved in accordance with the invention in that the dark space shield is electrically floating, and has an extension or flange separated from the target by a gap which is so large that no plasma can ignite between the target and the dark space shield, and the gap does not become adversely affected by back-scattered material.

This assures that no loading of the target surface with reaction products will take place in the outer area or outside of the target. In the outer area no coating of the edges takes place and no oxide forms, and therefore arcing no longer occurs, so that the sputtering process remains stable through its entire course, since the outer regions of the cathode body are protected by the massive, electrically floating shields.

Thus the utilization of the target is also improved in a simple manner, since only the area of the target material which is exposed or uncovered is used or ablated. Furthermore, the more stable arrangement according to the invention results in a more stable reactive process and thus also a longer target life is achieved since the target is less contaminated with reaction products. The target therefore can be utilized substantially better than before, since the elimination of contamination with any reaction products prevents the formation of insulating areas so that electric arcing can no longer occur. Such problems formerly occurred especially in the sputtering of zinc oxides. The formerly necessary cleaning work due to spotting can now be eliminated. By the elimination of these formerly common and very difficult cleaning cycles, the manufacturing process can proceed at lower cost. Due to the advantageous configuration of the dark space shield, high-purity coatings can be produced on sensors and data storage media, since no contamination by the material of the holding claws occurs. It was formerly common to fasten the target onto the bonding plate or ground body with external screws or claws. In the outer area the ablation is slight but formerly this could not be avoided, so that this ablation of the claws used to cause impurities on the substrate. If, for example, the fasteners were made of iron, iron was also deposited on the coating and data media made in this manner were no longer usable. Due to the advantageous shielding of the fasteners or claw strips with non-ablatable shielding, contamination on the substrate surface was largely prevented. It is advantageous, furthermore, that the dark space shield is disposed above the spacer at a distance from the outside of the base plate and base body, and the fastenings were shielded.

It is furthermore advantageous that a base plate is mounted on the cathode base body and on it the target is fixedly disposed (bonded on).

An additional possibility is, according to a further development of the apparatus according to the invention, that the parts of the bonding plate and cathode base body which are under voltage are surrounded by a shield that is electrically floating, so that sputtering is prevented in these areas.

In further development of the invention it is advantageous that the dark space shield consists of a conductive metal material and is electrically insulated from the cathode and the target.

According to a preferred embodiment of the solution according to the invention, provision is lastly made so that the dark space shield has on its inner side recesses which serve for the at least partial accommodation of fastening means by which the target is fastened on the base plate and/or on the base body. By the self-supporting arrangement of the dark space shield and by the use of the stand-off insulators assurance is provided in a structurally simple manner that only the target will be ablated, while the other parts remain unaffected. Through the use of the gap between the dark space shield and the target as well as the base body assurance is furthermore provided that no arcing will occur. To this end it is advantageous that the stand-offs are made of nonconducting material.

It is of special importance for the present invention that the distance of the one limb of the dark space shield from the outer side of the base plate is less than the distance of the second limb of the dark space shield from the outside of the base body. By making the two limbs of the dark space shield turn around the base plate and the base body assurance is provided that only the target itself will be ablated or sputtered.

It is furthermore advantageous that the dark space shield has an outlying end surface facing away from the base body, and is set back from the outer end face of the target.

For this purpose it is advantageous that the dark space shield is disposed above the stand-off at a parallel distance from the outer side of the base plate and/or from the outer side of the base body and covers the fastening means.

It is furthermore advantageous that the distance of the one limb of the dark space shield from the outer side of the base plate is less than the distance of the second limb of the dark space shield from the outside of the base body.

According to a further development of the apparatus according to the invention, an additional possibility is that the dark space shield has on its inner side openings which serve at least partially for the accommodation of fastening means by which the target is fastened on the base plate and/or on the limbs of the base body.

Additional advantages and details of the invention are set forth in the claims and in the description, and represented in the drawing, and it is to be noted that all individual features and all combinations of individual features are important to the invention.

BRIEF DESCRIPTION OF THE DRAWING

Referring to the drawing, there is shown a fragmentary sectional representation of approximately one half of a magnetron cathode in a simplified schematic structure, as indicated by axis X—X.

DETAILED DESCRIPTION OF A PREFERRED EMBODIMENT

In the drawing, 1 identifies the or cathode base body, which can be of a trough shape or any other shape. In the cathode base body 1 there is at least one cooling passage 5 through which water can flow and which is sealed off by the base plate 2. The cathode base body 1 and the base plate 2 consist of a nonmagnetic material, preferably of copper. In the trough-like hollow body is a magnet system 6 which consists of a ferromagnetic yoke plate 7 and numerous permanent magnets 8 whose magnetization is indicated by arrows. The outer permanent magnets 8 form a row in the shape of a racetrack and the inner permanent magnets 8 form a straight row.

The base body 1 is part of a magnetron cathode represented diagrammatically only in part, in which the plasma is formed in front of a target 3 by an appropriate magnetic field configuration and is thus confined.

In the sputtering process, for example with substrate bias, the substrate is insulated from the electrical ground. During the coating process, a negative bias is then applied to the substrate. This bias voltage produces the result that the coating is bombarded with inert gas ions as it grows. If the bias voltage is too great, i.e., beginning at a voltage of about 200 V, the inert gas ions pick up so much energy that they penetrate deeper into the growing coating and are bound therein.

By the appropriate setting of the process parameters the properties of a coating can be varied. In order to substantially prevent contamination during the sputtering process, all parts not necessary for the sputtering process are appropriately shielded or covered, so that only at the effective target surface does any sputtering take place.

The target 3 represented in section in the drawing has a flat target surface 9 before the process begins. The target 3 is fastened on the base plate 2 which in turn is fastened by fastening means or screws 27 to the trough-shaped base body 1 containing the magnet system 6.

The target 3 is adjoined on both sides by a dark space shield 11 which is L-shaped in cross section and, with reference to the drawing, it consists of a horizontal limb 29 and a vertical limb 30.

The dark space shield 11 formed of the limbs 29 and 30 is mounted floatingly, and therefore is at a slight distance away from one end 19 of the base plate 2 and an outer side 23 of the base body 1. The gap constituted by this space between the limb 29 and the end 19 is equal to or smaller than the gap between the outer side 23 of the base body 1 and the limb 30 of the dark space shield 11. These gaps preferably are smaller than the dark space distance of the plasma. The gaps are so great that no plasma can ignite between target 3 and the dark space shield 11 and that the gaps do not become adversely affected by back-scattered material.

The voltage-bearing parts of the base plate 2 and of the cathode base body 1 are surrounded by the electrically floating shield or dark space shield 11 such that only the still-exposed target surface is sputtered or sprayed away.

The dark space shield 11 is made of a conductive metal material and insulated from the base body or cathode body 1 and the target 3.

Electrically nonconductive stand-offs 20 serve for this purpose and are provided in the gap between the dark space shield and the base body 1. The stand-offs 20 are advantageously made of a nonconductive material.

The dark space shield 11 has an outer surface 21 which faces away from the base body 1 and is situated in the same transverse plane as the outer target surface 9. The surface 21 of the dark space shield facing away from the base body 1 can lie in the same transverse plane or can even be slightly set back from the outer target surface 9 of target 3.

So that the individual fastening means 27 may remain protected from the sputtering process, the dark space shield 11 has on its inwardly facing side recesses 26 which serve to at least partially accommodate the fastening means 27 by which the target 3 is fastened on the base plate 2 and/or on the limbs of the base body 1.

While there has been described what is at present considered to be the preferred embodiment of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. The method of operating a sputtering cathode which operates on the magnetron principle, comprising: utilizing a cathode body which has a target having a sputtering surface which is an outwardly facing surface, utilizing a magnet system behind the target and having poles of opposite polarity lying one opposite the other for the production of magnetic lines of force which issue from the target and, after running through arcuate paths, re-enter the target, utilizing a limb of a dark space shield running parallel to the sputtering surface and having an inner margin and covering marginal areas of the target lying outside of an erosion zone, electrically floating the dark space shield and providing the dark space shield with at least one limb separated from the target by a gap which is so great that no plasma can ignite between the target and the dark space shield and that the gap does not become adversely affected by back-scattered material and providing the dark-space shield with an externally lying end face facing away from the cathode body and lying in the same transverse plane as the sputtering surface of the target.

2. The method according to claim 1, which includes mounting on the cathode body a base plate on which the target is fixedly bonded, 3. The method according to claim 2, which includes providing the base plate and the cathode body with voltage bearing parts which are surrounded by the dark space shield.

4. The method according to claim 2, which includes providing the dark space shield with a first limb and a second limb and spacing the first limb from the base plate by a distance less than the second limb is spaced from the cathode body.

5. The method according to claim 1, which includes making the dark space shield of a metallically conducting material insulated electrically from the cathode body and the target.

6. The method according to claim 5, which includes electrically insulating the dark space shield from the cathode body and the target by at least one stand-off insulator.

7. The method according to claim 6, which includes providing fastening means and disposing the dark space shield above the at least one stand-off insulator at a distance from the cathode body and covering the fastening means.

8. The method according to claim 1, which includes providing the externally lying face of the dark-space shield with a set back from the sputtering surface of the target.

* * * * *